United States Patent
Guo et al.

(10) Patent No.: US 7,369,376 B2
(45) Date of Patent: May 6, 2008

(54) AMORPHOUS LAYERS IN A MAGNETIC TUNNEL JUNCTION DEVICE

(75) Inventors: Yimin Guo, San Jose, CA (US); Tai Min, San Jose, CA (US); Po-Kang Wang, San Jose, CA (US)

(73) Assignees: Headway Technologies, Inc., Milpitas, CA (US); Applied Spintronics, Inc., Milpitas, CA (US)

( * ) Notice: Subject to any disclaimer, the term of this patent is extended or adjusted under 35 U.S.C. 154(b) by 447 days.

(21) Appl. No.: 11/080,867

(22) Filed: Mar. 15, 2005

(65) Prior Publication Data

US 2006/0209590 A1    Sep. 21, 2006

(51) Int. Cl.
G11B 5/39 (2006.01)

(52) U.S. Cl. ............... 360/324.2; 360/324.12
(58) Field of Classification Search ............. 360/324.2, 360/324.12
See application file for complete search history.

(56) References Cited

U.S. PATENT DOCUMENTS

| | | | |
|---|---|---|---|
| 5,650,958 A | 7/1997 | Gallagher et al. | 365/173 |
| 5,966,012 A | 10/1999 | Parkin | 324/252 |
| 6,166,948 A | 12/2000 | Parkin et al. | 365/173 |
| 6,181,537 B1* | 1/2001 | Gill | 360/324.2 |
| 6,452,762 B1 | 9/2002 | Hayashi et al. | 360/324.1 |
| 6,665,155 B2 | 12/2003 | Gill | 360/324.12 |
| 6,703,654 B1 | 3/2004 | Horng et al. | 257/295 |
| 6,756,237 B2 | 6/2004 | Xiao et al. | 438/3 |
| 6,818,458 B1 | 11/2004 | Gill | 438/3 |
| 6,831,312 B2 | 12/2004 | Slaughter et al. | 257/295 |
| 6,839,206 B2 | 1/2005 | Saito et al. | 360/324.2 |
| 7,026,671 B2* | 4/2006 | Mizuguchi et al. | 257/295 |
| 7,130,167 B2* | 10/2006 | Gill | 360/324.12 |
| 2003/0184925 A1* | 10/2003 | Hasegawa et al. | 360/324.12 |
| 2004/0229430 A1 | 11/2004 | Findeis et al. | 438/257 |
| 2004/0257719 A1* | 12/2004 | Ohba et al. | 360/324.2 |
| 2005/0111147 A1* | 5/2005 | Hiramoto et al. | 360/324.11 |
| 2005/0170218 A1* | 8/2005 | Kishi et al. | 428/694 TM |

OTHER PUBLICATIONS

"Magnetostriction of Co-Base Amorphous Alloys and High Frequency Permeability in their Sputtered Films (Invited)," by Hiroyasu Fujimori et al., Jrnl. of Applied Physics, vol. 55, No. 6, Mar. 15, 1984, pp. 1769-1774.

"Electrode Roughness and Interfacial Making Effects on the Tunnel Junction Thermal Stability", by S. Cardoso et al., Jrnl. of Applied Physics, vol. 89, No. 11, Jun. 1, 2001, pp. 6650-6652.

* cited by examiner

*Primary Examiner*—Jefferson Evans
(74) *Attorney, Agent, or Firm*—Saile Ackerman LLC; Stephen B. Ackerman

(57) ABSTRACT

An improved TMR device is disclosed. The ferromagnetic layers of the device, particularly those that contact the dielectric tunneling layer have an amorphous structure as well as a minimum thickness (of about 15 Å). A preferred material for contacting the dielectric layer is CoFeB. Ways of overcoming problems relating to magnetostriction are disclosed and a description of a process for manufacturing the device is included.

15 Claims, 1 Drawing Sheet

AMORPHOUS LAYERS IN A MAGNETIC TUNNEL JUNCTION DEVICE

FIELD OF THE INVENTION

The invention relates to the design and fabrication of a magnetic tunnel junction (MTJ) Magnetic Random Access Memory (MRAM) array, and more specifically to magnetic tunnel junction devices with improved signal-to-noise ratio and switching behavior.

BACKGROUND OF THE INVENTION

The magnetic tunnel junction (MTJ) basically comprises two electrodes, which are layers of ferromagnetic material, separated by a tunnel barrier layer, which is a thin layer of insulating material. The tunnel barrier layer must be sufficiently thin so that there is a probability for charge carriers (typically electrons) to cross the layer by means of quantum mechanical tunneling. The tunneling probability is spin dependent, however, depending on the availability of tunneling states with different electron spin orientations. Thus, the overall tunneling current will depend on the number of spin-up vs. spin-down electrons, which in turn depends on the orientation of the electron spin relative to the magnetization direction of the ferromagnetic layers. Thus, if these magnetization directions are varied for a given applied voltage, the tunneling current will also vary as a function of the relative directions. As a result of the behavior of an MTJ, sensing the change of tunneling current for a fixed potential can enable a determination of the relative magnetization directions of the two ferromagnetic layers that comprise it. Equivalently, the resistance of the MTJ can be measured, since different relative. magnetization directions will produce different resistances.

The use of an MTJ as an information storage device requires that the magnetization of at least one of its ferromagnetic layers can be varied relative to the other and also that changes in the relative directions can be sensed by means of variations in the tunneling current or, equivalently, the junction resistance. In its simplest form as a two state memory storage device, the MTJ need only be capable of having its magnetizations put into parallel (low resistance) or antiparallel (high resistance) configurations (writing data) and that these two configurations can be sensed by tunneling current variations or resistance variations (reading data). In practice, the free ferromagnetic layer can be modeled as having a magnetization which is free to rotate but which energetically prefers to align in either direction along its easy axis (the direction of magnetic crystalline anisotropy). The magnetization of the fixed layer may be thought of as being permanently aligned in its easy axis direction. When the free layer is anti-aligned with the fixed layer, the junction will have its maximum resistance, when the free layer is aligned with the fixed layer, the minimum resistance is present.

In typical MRAM circuitry, the MTJ devices are located at the intersection of current carrying lines called word lines and bit lines. When both lines are simultaneously activated, information gets written on the device, i.e. the magnetization direction of its free layer is changed. When only one line is activated, the resistance of the device can be sensed, so the device is effectively read.

A routine search of the prior art was performed with the following references of interest being found:

U.S. Pat. No. 5,650,958 (Gallagher et al) discloses a barrier layer between free and pinned layers while U.S. Pat. No. 6,166,948 (Parkin et al) shows a multi-layer free layer structure and U.S. Pat. No. 6,665,155 (Gill) describes an amorphous cobalt niobium or cobalt hafnium layer between two free layers.

In U.S. Pat. No. 5,966,012 (Parkin), U.S. Pat. No. 6,839,206 (Saito et al), and U.S. Pat. No. 6,756,237 (Xiao et al) use of an amorphous barrier layer is disclosed and, in U.S. Pat. No. 6,831,312, Slaughter et al. teach at least one amorphous layer for smoothness so that the free layer and the ferromagnetic layers, for example, may comprise amorphous alloys of CoFeB.

U.S. Pat. No. 6,818,458 (Gill) shows an amorphous alloy of CoFeX as a ferromagnetic layer for smooth growth of a thin barrier layer while U.S. Pat. No. 6,452,762 (Hayashi et al) teaches that the fixed layer and the free layer may be of amorphous material. In U.S. Pat. No. 6,703,654 (a Headway patent by Horng et al) a smooth bottom electrode is disclosed. Finally, U.S. Patent Publication 2004/0229430 (Findeis et al) describes a free layer comprising multiple layers including amorphous CoFeB alloys.

Because of their greater dR/R and very low Hc, MTJ devices with amorphous CoFeB free layers are preferred for ultra high density and low power MRAM applications. In practice, however, the extremely high positive magnetostriction of CoFeB is a source of problems such as a widely varying switching field distribution among MRAM arrays. The present invention discloses how these problems can be overcome through suitable control of the composition and structure of free layer films.

SUMMARY OF THE INVENTION

It has been an object of at least one embodiment of the present invention to provide a TMR based device having improved sensitivity.

Another object of at least one embodiment of the present invention has been that said device have increased breakdown and reduced current characteristics.

Still another object of at least one embodiment of the present invention has been that said device have minimal magnetostrictive behavior.

A further object of at least one embodiment of the present invention has been to provide a process for manufacturing said device.

These objects have been achieved by arranging for the ferromagnetic layers of the device to have an amorphous structure, particularly those films that contact the dielectric layer. An amorphous film is smoother than a film with crystalline structure since it has no preferred texture. To ensure the dissipation of any epitaxial effects that derive from the layer on which each of these amorphous layers is deposited, they are required to have a minimum thickness (of about 15 Å). A preferred material for contacting the dielectric layer is CoFeB. This has an amorphous structure when certain constituents exceed a particular concentration. CoFeB does, however, have an undesirably large magnetostriction constant. Ways of overcoming this latter problem are disclosed and a description of a process for manufacturing the device is included.

DESCRIPTION OF THE PREFERRED EMBODIMENTS

Figure 1:
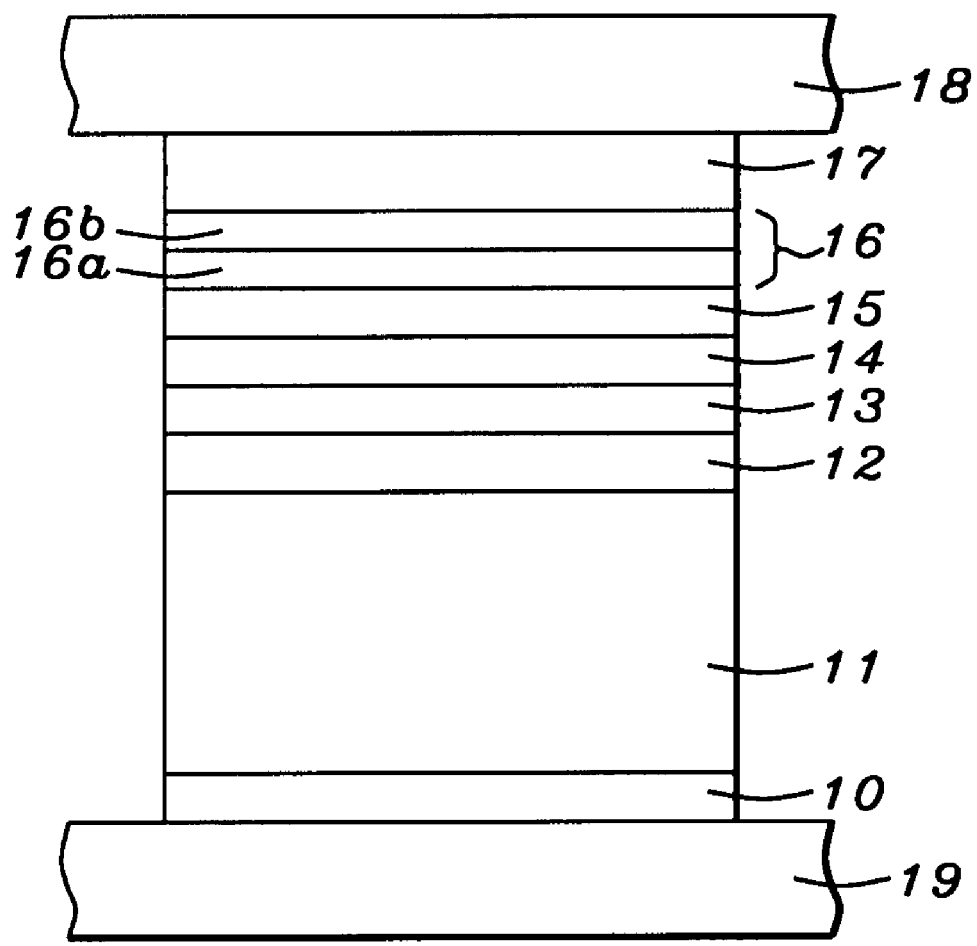
FIG. 1 is a schematic illustration of the structure of the invention

It is known that the smoothness of TMR films, especially, the dielectric layer, is critical to achieving high dr/r and other vital parameters such as breakdown voltage(Vbd), the dropping rate of TMR versus applying voltage, and $V_{50}$ (voltage at which dR/R is reduced by 50%). Thus improved techniques are needed to obtain a smooth film prior to depositing the dielectric layer.

The structure of the invention is schematically illustrated in FIG. 1. Seen there are upper and lower conductive leads 18 and 19 with seed layer 10 being on layer 19. Antiferromagnetic layer 11 lies on seed layer 10 while AP2 and AP1 layers, 12 and 14 respectively, are immediately above it, with AFM decoupling layer 13 between them. Dielectric tunneling layer 15 lies on AP1 layer 14 and free layer 16 is on top of layer 15. Capping layer 17, on free layer 16, completes the structure.

To manufacture the invention, the layers are deposited in the order described in the previous paragraph and as shown in FIG. 1.

The ferromagnetic layers all have an amorphous structure and are required to have a minimum thickness, particularly those films that contact the dielectric layer. A preferred material for contacting the dielectric layer is CoFeB. This has an amorphous structure when certain constituents exceed a certain concentration. An amorphous film is smoother than a film with crystalline structure since it has no preferred texture, but to fully utilize this smoothness, especially when grown on top of a crystalline film, the thickness needs to exceed a certain critical value.

Although CoFeB meets these criteria, it also has a relatively large magnetostriction constant (about $10^5$). Accordingly, if we elect to use it for the layer on whose surface the tunneling layer is grown (i.e. AP1), the layer on the tunneling dielectric's other surface (i.e. the free layer) needs to have a magnetostriction constant of the opposite sign and approximately equal absolute value so the final structure has a net magnetostriction constant that is close to zero.

Materials that satisfy this requirement, as well as being suitable for use as a free layer, include CoB, CoNb, and CoNbHf. This arrangement works best with an alumina tunneling dielectric but when a magnesia tunneling dielectric is used, it is preferable to have CoFeB on both its surfaces. In that case, the free layer is a laminate (layers 16a and 16b in FIG. 1) of CoFeB and one or more of the materials already mentioned (CoB, CoNb, and CoNbHf), to a sufficient thickness to cause the full structure to have a magnetostriction constant very close to zero.

When $Al_2O_3$ was used for the dielectric layer of a typical NiFe based TMR film, the dr/r is about 42%, Vbd about 1.50V and $V_{50}$ about 560 mV. With a $(CoFe)_4B$ film having the same dielectric thickness, the dr/r is about 73.2%, Vbd about 1.76V and $V_{50}$ about 780 mV, i.e. all have significantly improved.

When MgO was used for the dielectric layer, an MTJ with $(CoFe)_4B$ for both the free and pinned layers, a dr/r of about 230% was achieved. However, the magnetostriction of a CoFeB film is positive ($+10^{-5}$) which is too large for an MTJ free layer. Reducing the Fe content makes the magnetostriction smaller but reducing Fe content too much would cause a drop of dR/R. Since the magnetostriction of CoB, CoNb, CoNbHf, CoTa, and CoW, all range from $-2 \times 10^{-6}$ to $-8 \times 10^{-6}$, these can be used directly on top of a CoFeB film to partially compensate for the positive magnetostriction of CoFeB, when forming an amorphous free layer having very small Hc. These results are summarized in TABLE I below:

TABLE I

| dielectric | free and pinned layers | dR/R % | $V_{bd}$ volts | $V_{50}$ mV |
|---|---|---|---|---|
| alumina | NiFe | 42 | 1.50 | 560 |
| alumina | CoFeB | 73.2 | 1.76 | 780 |
| magnesia | CoFeB | 230 | — | — | where $V_{bd}$ is the breakdown voltage and $V_{50}$ is the voltage at which dR/R is reduced by 50%

The fixed multilayers, comprising a 1st ferromagnetic layer's magnetization is substantially antiparallel to the magnetization of the 2nd ferromagnetic layer, these layers being separated by a thin layer of material such as (but not limited to) Rh, Ru, Cr, or Cu which serve to maintain strong antiparallel magnetic coupling between the two ferromagnetic layers, the magnetic moments of these two layers being closely matched so as to reduce any net moment of the fixed multilayer. An antiferromagnetic layer of (but not limited to) PtMn, NiMn, OsMn, IrMn, or PtPdMn is positioned immediately below AP2 in order to fix its magnetization direction uni-directionally.

What is claimed is:

1. A magnetic tunnel junction device, comprising:
   a lower conductive electrode;
   a seed layer on said lower conductive electrode;
   an antiferromagnetic layer on said seed layer;
   an AP2 layer on said antiferromagnetic layer;
   an antiferromagnetic coupling layer on said AP2 layer;
   an AP1 layer on said antiferromagnetic coupling layer;
   a tunneling layer of aluminum oxide on said AP1 layer;
   on said tunneling layer, a free layer comprising first and second free sub-layers;
   said first free sub-layer further comprising a layer of CoFeB containing at least 10 atomic percent boron, having an amorphous structure, a thickness of at least 15 Angstroms, and a magnetostriction constant whose absolute value is no greater than about $1.5 \times 10^{-5}$;
   said second free sub-layer further comprising a layer of material selected from the group consisting of CoB, CoNb, and CoNbHf, having an amorphous structure, a thickness of at least 15 Angstroms, and a magnetostriction constant whose absolute value and sign are negative such that it effectively cancels out magnetostriction due to said first free sub-layer, whereby said magnetic tunnel junction device has a magnetostriction constant whose absolute value is greater than $0.5 \times 10^{-5}$;
   a capping layer on said free layer; and
   an upper conductive electrode on said capping layer.

2. The magnetic tunnel junction device described in claim 1 wherein said antiferromagnetic layer is selected from the group consisting of PtMn, NiMn, OsMn, IrMn, and PtPdMn.

3. The magnetic tunnel junction device described in claim 1 wherein said seed layer is selected from the group consisting of Ta, NiCr, NiFeCr.

4. The magnetic tunnel junction device described in claim 1 wherein said capping layer is selected from the group consisting of Ru, Rh, Ta, TaO, $Al_2O_3$, Cu, and TaN.

5. The magnetic tunnel junction device described in claim 1 wherein said antiferromagnetic coupling layer is selected from the group consisting of Rh, Ru, Cr, Cu, and Ir.

6. The magnetic tunnel junction device described in claim 1 wherein said free layer has its anisotropy maximized along a direction of its long axis.

7. A magnetic tunnel junction device, comprising:
a lower conductive electrode;
a seed layer on said lower conductive electrode;
an antiferromagnetic layer on said seed layer;
an AP2 layer on said antiferromagnetic layer;
an antiferromagnetic coupling layer on said AP2 layer;
an AP1 layer on said antiferromagnetic coupling layer;
a tunneling layer of magnesium oxide on said AP1 layer;
free layer on said tunneling layer;
said free layer having an amorphous structure, a thickness of at least 15 Angstroms, and further comprising at least two layers whose magnetostriction constants are of opposite sign, including first and second free sub-layers, said first free sub-layer being CoFeB, having an amorphous structure and a thickness of at least 15 Angstroms whereby said first free sub-layer and said second free sub-layer together have a net magnetostriction constant whose absolute value is less than $0.5 \times 10^{-5}$;
a capping layer on said free layer; and
an upper conductive electrode on said capping layer.

8. The magnetic tunnel junction device described in claim 7 wherein said antiferromagnetic layer is selected from the group consisting of PtMn, NiMn, OsMn, IrMn, and PtPdMn.

9. The magnetic tunnel junction device described in claim 7 wherein said seed layer is selected from the group consisting of Ta, NiCr, NiFeCr.

10. The magnetic tunnel junction device described in claim 7 wherein said capping layer is selected from the group consisting of Ru, Rh, Ta, TaO, $Al_2O_3$, Cu, and TaN.

11. The magnetic tunnel junction device described in claim 7 wherein said antiferromagnetic coupling layer is selected from the group consisting of Ru, Rh, Ir, Cr, and Cu.

12. The magnetic tunnel junction device described in claim 7 wherein said free layer has its crystalline anisotropy maximized along a direction of its long axis.

13. A process, to form a magnetic tunnel junction device, comprising:
providing a lower conductive electrode and depositing thereon a seed layer;
depositing an antiferromagnetic layer on said seed layer;
depositing an AP2 layer on said antiferromagnetic layer;
depositing an antiferromagnetic coupling layer on said AP2 layer;
depositing, to a thickness of at least 15 Angstroms, an AP1 layer on said antiferromagnetic coupling layer;
depositing a dielectric tunneling layer of aluminum oxide on said AP1 layer;
by depositing a layer of amorphous material to a thickness of at least 15 Angstroms, forming, on said tunneling layer, a free layer comprising first and second free sub-layers, said second free sub-layer being selected from the group consisting of CoB, CoNb, and CoNbHf;
depositing a capping layer on said free layer; and
depositing an upper conductive electrode on said capping layer.

14. The process recited in claim 13 wherein said tunneling layer is aluminum oxide, said first free sub-layer is CoFeB containing at least 10 atomic percent boron, and said AP1 layer has a magnetostriction constant whose absolute value is no greater than $1.5 \times 10^{-5}$.

15. A process to form a magnetic tunnel function device, comprising:
providing a lower conductive electrode and depositing thereon a seed layer;
depositing an antiferromagnetic layer on said seed layer;
depositing an AP2 layer on said antiferromagnetic layer;
depositing an antiferromagnetic coupling layer on said AP2 layer;
depositing, to a thickness of at least 15 Angstroms, an AP1 layer on said antiferromagnetic coupling layer;
depositing a dielectric tunneling layer of magnesium oxide on said AP1 layer;
forming said free layer by depositing at least two layers whose magnetostriction constants are of opposite sign to each other, thereby causing said free layer to have a net magnetostriction constant whose absolute value is less than $0.5 \times 10^{-5}$;
depositing a capping layer on said free layer; and
depositing an upper conductive electrode on said capping layer.

* * * * *